United States Patent [19]
Heinrich et al.

[11] Patent Number: 4,460,882
[45] Date of Patent: Jul. 17, 1984

[54] BRAKE MAGNET FOR WATT-HOUR METERS

[75] Inventors: Alfred A. Heinrich; Karl E. Oerter, both of Bergisch-Gladbach, Fed. Rep. of Germany

[73] Assignee: Max Baermann GmbH, Bergisch-Gladbach, Fed. Rep. of Germany

[21] Appl. No.: 453,772

[22] Filed: Dec. 27, 1982

[30] Foreign Application Priority Data

Dec. 24, 1981 [DE] Fed. Rep. of Germany ....... 3151429

[51] Int. Cl.³ .............................................. H01F 7/08
[52] U.S. Cl. .................................... 335/225; 335/303
[58] Field of Search ............... 335/225, 302, 303, 306, 335/224

[56] References Cited

U.S. PATENT DOCUMENTS 3,588,768 6/1971 Baermann .......................... 335/225
4,337,449 6/1982 Oudet .................................. 335/225

FOREIGN PATENT DOCUMENTS 1516917 9/1975 Fed. Rep. of Germany .

OTHER PUBLICATIONS

Elektrotechnischen Zeitschriften Issue 27, pp. 601 to 606.

Primary Examiner—George Harris
Attorney, Agent, or Firm—Body, Vickers & Daniels

[57] ABSTRACT

A generally U-shaped brake magnet for a watt-hour meter molded from a thermosetting resinous material having powdered permanent magnet material embedded in the resinous material only adjacent the surfaces of the legs of the U which form the air gap into which the brake meter disc extends and which may further include reinforcing material embedded in the legs and the base of the U. These reinforcing materials can be non-magnetic metal particles having sharp edges or non-magnetic fibrous material.

6 Claims, 2 Drawing Figures

BRAKE MAGNET FOR WATT-HOUR METERS

The invention relates to a brake magnet for watt-hour meters comprising two permanent magnet parts, which are connected by a supporting member in such a manner, that their opposing surfaces, which are magnetised with alternate poles, form an air gap into which the meter braking disc extends.

Known brake magnets for watt hour meters mainly comprise a U-shaped carrier body on the arms of which permanent magnet bodies with two or multiple pole magnetisation are fitted opposite each other in such a manner, that an air gap exists between the opposing magnetized surfaces, the air gap being filled by the magnetic flux of the magnet bodies. The meter braking disc extends into this air gap. The U-shaped carrier body may be made of a ferro-magnetic material, so that it serves as an iron return path. If the permanent magnet bodies are magnetised in such a manner, that the poles are only present on one surface, a non-magnetic material, such as aluminum, can be used for the carrier body. The carrier body must have a high resistance to breakage or distortion, so that the air gap between the magnets fitted on it is not altered, as this would have a disadvantageous effect on the indicator accuracy of the watt-hour meter. (DE-PS No. 15 16 917).

Molded magnets are used in many cases as permanent magnet bodies. These molded magnets are made in a known manner by molding crushed permanent magnet material, particularly Alnico alloys, with a binder, which brings about the cohesion of the permanent magnet particles. Thermosetting plastics are mainly used as binders for this purpose. These molded magnets have proven their value in practice, as they can be manufactured very economically. In the molding process, the moldings can be made dimensionally very stable and in the most diversified shapes without any grinding being involved, as is the case with cast and sintered alloy magnets. Holding parts, temperature compensation parts, sockets and similar can be molded into or onto the magnets very simply during the manufacturing process. Furthermore, the molded magnets can be mass produced with high magnetic uniformity. (ETZ, 62nd year of publication 1941, Issue 27, Pages 601-606, Dehler: Manufacture and Characteristics of Molded Magnets).

Molded magnets with complicated shapes have however the disadvantage of being susceptible to breakage and distortion when heavily loaded.

Brake magnets according to prior art with U-shaped carrier bodies, on which the magnet bodies are fitted, are expensive, and have relatively high mounting costs. Contrary to these known brake magnets the invention shows a new way to create a brake magnet, which utilizes the advantages of the plastic-bonded molded magnet but avoids its disadvantages. In particular it is the object of the invention to create an economical brake magnet, which ensures a high stability and resistance to breakage and only requires minimal mounting costs.

This object is achieved by a brake magnet of the type mentioned at the beginning, that the brake magnet is designed in one piece and comprises a generally U-shaped body made from molded, thermosetting plastic, in which permanent magnet powder particles, preferably Alnico powder, are embedded in the legs of the body adjacent the facing surfaces of the legs. Additionally, if necessary, the base is provided with strengthening materials for bringing about a high mechanical strength and for maintaining a constant air gap, which materials are positioned inside and/or outside the supporting base and which extend wholly or partly into the plastic-bonded permanent magnet particles.

The advantages brought about by the invention can be seen on the one hand in the considerable saving on permanent magnet material, as the permanent magnet particles are only embedded in the plastic binder on the parts required for producing the magnetic flux, and on the other hand in that the base connecting the permanent magnet parts contributes to the particularly good mechanical strength by means of the strengthening materials positioned inside and if necessary outside the same, so that a constant air gap is insured.

It has been shown in a surprising manner, that a particularly good stability is achieved by embedding in the plastic binder of the distancing part, or base, metal particles of non-magnetic material, such as brass, copper, aluminum or bronze, which have an irregular shape with many points.

The particularly high strength values achieved by this shaping can be explained by the points of the individual metal particles, which hook not only into each other, but also into the binder giving a firm compound with the binder. It has also been recognised, that due to the insulating property of the binder surrounding the metal particles of non-magnetic material the forming of eddy currents, which can arise during magnetisation of the permanent magnet parts, is avoided.

A further increase in the strength or resistance to distortion is achieved by embedding fibres, preferably glass fibres, or fabric in the binder of the distancing part or base as an additional strengthening material to the metal particles, whereby these strengthening materials wholly or partly engage in or protrude into the plastic-bonded magnetic parts provided with permanent magnet particles.

Flat strengthening materials, such as non-magnetic metallic material and/or resin impregnated paper in the form of frames or profiles can also be embedded or molded in.

A further advantage of the invention is, that on the distancing part or base or supporting base with non-magnetic particles, particularly good drill holes and threads can be provided, in order that the brake magnet can be fitted on the meter frame.

During manufacture of the brake magnet by molding, a circular recess 10 is provided between one permanent magnet part 2 and the distancing part 4, in which an adjusting magnet (not shown) for fine adjustment of the braking moment is positioned.

During manufacture of the braking magnet by molding a, preferably circular, recess can be provided simultaneously between the permanent magnet part and the distancing part, in which an adjusting magnet for fine adjustment of the braking moment can be fitted in a known manner.

The invention may take physical form in certain parts and arrangement of parts; one embodiment of the invention, from which further details will become obvious, will be described in detail in this specification and illustrated in the accompanying drawings, which form a part hereof and wherein.

Figure 1:
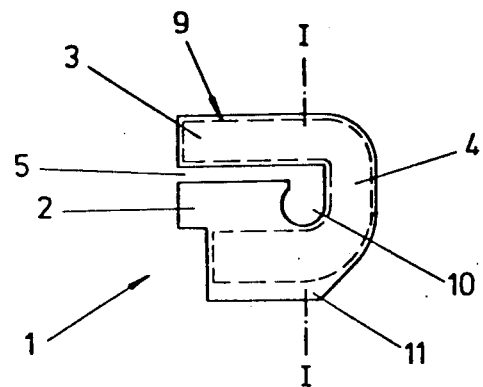
FIG. 1 is a side view of the brake magnet
Figure 2:
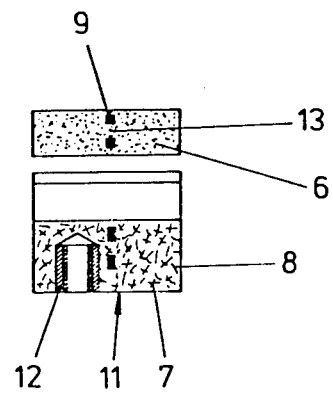
FIG. 2 is a longitudinal section through the brake magnet according to line I—I of FIG. 1.

In the embodiment according to FIG. 1 the brake magnet 1 comprises the two permanent magnet parts 2 and 3, which are held by the distancing or base part 4 to each other in such a manner, that an air gap 5 is provided between the magnetised surfaces of the permanent magnet parts 2,3 into which the braking magnet disc (not illustrated) extends. The brake magnet 1 is designed in one piece and is molded from thermosetting plastic in one work process, whereby permanent magnet powder 6 of Alnico is embedded only in the permanent magnet parts 2,3, adjacent the magnetised surfaces while in the integral distancing part or base 4 and the also integral supporting base 11 strengthening materials are provided for bringing about a high mechanical strength or maintaining a constance air gap 5. With the present embodiment, aluminum particles 7 are provided in the distancing part or base 4 and the supporting base 11 as strengthening material, as can be clearly seen in FIG. 2. Glass fibres 8 and a strengthening frame 9 with perforations 13 are also provided. The strengthening frame engages in the permanent magnet parts 2,3, as illustrated in FIG. 1 by broken lines. The aluminum particles 7 have an irregular shape with several points. During the molding process the points of the individual aluminum particles hook not only into each other but also into the binder giving a firm compound with the binder, which results in the surprising strength characteristics of the brake magnet. For the purpose of mounting the brake magnet on the meter frame, a threaded sleeve 12 is molded or glued into the supporting base 11. The threaded sleeve can also have an additional thread on the outside and be screwed into the drill hole on the supporting base, if necessary also being glued.

Having described our invention we claim:

1. A brake magnet for watt-hour meters comprised of a molded one piece U-shaped body having a pair of spaced parallel legs and an integral base member, said legs having opposed facing surfaces defining an air gap into which a meter braking disc is adapted to extend, said body being formed of a molded thermosetting resin having permanent magnetic powder particles embedded only in each of said legs adjacent said facing surfaces.

2. The brake magnet of claim 1 wherein strengthening materials are molded into said legs remote from said facing surfaces in said base.

3. The brake magnet of claim 2 wherein said strengthening materials are non-magnetic metal particles having an irregular shape with several points.

4. The brake magnet of claim 2 wherein the strengthening materials are mineral filling materials, such as powdered stone, included in said thermosetting resin.

5. The brake magnet of claim 2, wherein said strengthening materials are profile parts of nonmetallic material, such as resin-impregnated paper, pressed onto or into the base.

6. The brake magnet of claim 2 where the strengthening materials are non-magnetic metal particles in combination with fibres, fabric and profile parts of non-magnetic metallic material.

* * * * *